United States Patent
Sun et al.

(10) Patent No.: US 8,784,599 B2
(45) Date of Patent: Jul. 22, 2014

(54) LASER INDUCED THERMAL IMAGING APPARATUS AND METHOD OF MANUFACTURING ORGANIC LIGHT EMITTING DISPLAY DEVICE USING THE SAME

(75) Inventors: Jin-Won Sun, Yongin (KR); Sok-Won Noh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 713 days.

(21) Appl. No.: 12/929,460

(22) Filed: Jan. 26, 2011

(65) Prior Publication Data
US 2011/0180203 A1 Jul. 28, 2011

(30) Foreign Application Priority Data

Jan. 27, 2010 (KR) ........................ 10-2010-0007445

(51) Int. Cl.
| | | |
|---|---|---|
| B29C 65/16 | (2006.01) | |
| B29C 65/66 | (2006.01) | |
| B32B 37/10 | (2006.01) | |
| B32B 37/26 | (2006.01) | |
| B32B 38/10 | (2006.01) | |
| B29C 65/72 | (2006.01) | |

(52) U.S. Cl.
USPC ............. 156/273.7; 156/272.8; 156/285; 156/382; 156/494; 156/538; 156/574; 156/576

(58) Field of Classification Search
USPC ........... 156/272.8, 273.7, 285, 382, 494, 538, 156/574, 576
See application file for complete search history.

(56) References Cited

U.S. PATENT DOCUMENTS

| | | | |
|---|---|---|---|
| 6,083,649 A | 7/2000 | Takeshita et al. | |
| 6,695,030 B1 | 2/2004 | Phillips et al. | |
| 8,062,444 B2 * | 11/2011 | Begon et al. | 156/64 |
| 8,623,167 B2 * | 1/2014 | Kim | 156/285 |
| 2003/0113656 A1 | 6/2003 | Tyan et al. | |
| 2003/0148208 A1 | 8/2003 | Phillips et al. | |
| 2003/0180638 A1 | 9/2003 | Tyan | |

(Continued)

FOREIGN PATENT DOCUMENTS

| | | |
|---|---|---|
| JP | 09-283025 A | 10/1997 |
| JP | 10-233352 A | 9/1998 |

(Continued)

OTHER PUBLICATIONS

Office Action for KR2010-0007445: Notification of Refusal; Nov. 7, 2011.*

(Continued)

Primary Examiner — Sonya Mazumdar
(74) Attorney, Agent, or Firm — Lee & Morse, P.C.

(57) ABSTRACT

A laser induced thermal imaging (LITI) apparatus includes a stage configured to support an acceptor substrate and a supporting portion configured to support a donor film and to move the donor film up and down relative to the stage so as to adjust a distance between the acceptor substrate and the donor film. The donor film includes a thin film to be disposed on the acceptor substrate. The stage includes a discharging outlet through which gas between the acceptor substrate and the donor film is discharged to the outside. The LITI apparatus may be used to laminate a film on an acceptor substrate including an organic light emitting display device.

19 Claims, 7 Drawing Sheets

(56) References Cited

U.S. PATENT DOCUMENTS

| | | |
|---|---|---|
| 2003/0203547 A1 | 10/2003 | Sakaguchi et al. |
| 2006/0042747 A1 | 3/2006 | Song et al. |
| 2006/0081332 A1 | 4/2006 | Kang et al. |
| 2007/0046770 A1 | 3/2007 | Noh et al. |
| 2009/0166561 A1 | 7/2009 | Kim et al. |

FOREIGN PATENT DOCUMENTS

| | | |
|---|---|---|
| JP | 11-142633 A | 5/1999 |
| JP | 11-153707 A | 6/1999 |
| JP | 2001-293783 A | 10/2001 |
| JP | 2006-179465 A | 7/2006 |
| KR | 10 2003-0048337 A | 6/2003 |
| KR | 10-2003-0051379 A | 6/2003 |
| KR | 10 2003-0074376 A | 9/2003 |
| KR | 10 2004-0017414 A | 2/2004 |
| KR | 10 2004-0017787 A | 2/2004 |
| KR | 10-2006-0020047 A | 3/2006 |
| KR | 10 2006-0035069 A | 4/2006 |
| KR | 10-2007-0024815 A | 3/2007 |
| KR | 10 2007-0115339 A | 12/2007 |
| KR | 10 2009-0072757 A | 7/2009 |

OTHER PUBLICATIONS

Office Action for KR2010-0007445: Decision to Grant; May 3, 2012.*

Japanese Office Action in JP 2010-180948, dated Jan. 17, 2012 (Sun, et al.).

Korean Notice of Allowance for KR 10-2010-0007445 dated May 3, 2012. Jin-Won Sun, et al.

Korean Office Action in KR 10-2010-0007445, dated Nov. 7, 2011 (Sun, et al.).

* cited by examiner

LASER INDUCED THERMAL IMAGING APPARATUS AND METHOD OF MANUFACTURING ORGANIC LIGHT EMITTING DISPLAY DEVICE USING THE SAME

BACKGROUND

1. Field of the Invention

Embodiments relate to a laser induced thermal imaging (LITI) apparatus and a method of manufacturing an organic light emitting display apparatus using the LITI apparatus. More particularly, embodiments relate to a LITI apparatus capable of increasing adhesion characteristics between a substrate and a donor film during lamination and minimizing the likelihood of an organic layer formed on the substrate being lifted off during removal of the donor film out, and a method of manufacturing an organic light emitting display apparatus using the LITI apparatus.

2. Description of the Related Art

An organic light emitting display device, which is a flat panel display device, includes an anode, a cathode, and an intermediate layer including at least an organic emission layer interposed between the anode and the cathode. An organic light emitting display device is a self-emissive display device, has a wide viewing angle, high contrast ratio, and high response speed, and is thus considered to be the next-generation display device. The organic light emitting display device may further include at least one organic layer in addition to a hole injecting layer (HIL), a hole transporting layer (HTL), an electron transporting layer (ETL), an electron injecting layer (EIL), and the organic emission layer, depending on whether the organic emission layer is formed of a polymer organic material or a small-molecule organic material.

For full color realization in the organic light emitting display device, an organic layer needs to be patterned. For small-molecule organic light emitting display devices, patterning includes a shadow mask method. For polymer organic light emitting display device, patterning includes an ink jet printing method or a laser induced thermal imaging (LITI) method. The LITI method is capable of minutely patterning an organic layer, may be used for a large surface, and is advantageous in achieving a high resolution.

SUMMARY

It is a feature of an embodiment to provide a laser induced thermal imaging (LITI) apparatus capable of improving adhesion between a donor film and an acceptor substrate during lamination, and a method of manufacturing an organic light emitting display apparatus using the LITI apparatus.

It is another feature of an embodiment to provide a laser induced thermal imaging (LITI) apparatus capable of reducing or eliminating lift-off of a film transferred to the acceptor substrate during delamination of the donor film, and a method of manufacturing an organic light emitting display apparatus using the LITI apparatus.

At least one of the above and other features and advantages may be realized by providing a laser induced thermal imaging (LITI) apparatus including a stage configured to support an acceptor substrate and a supporting portion configured to support a donor film and to move the donor film up and down relative to the stage so as to adjust a distance between the acceptor substrate and the donor film. The donor film may include a thin film to be disposed on the acceptor substrate.

The stage may include a discharging outlet through which gas between the acceptor substrate and the donor film is discharged to the outside.

The supporting portion may include a first member supporting a first end portion of the donor film and a second member supporting a second end portion, opposite the first end portion of the donor film. The first member and the second member may individually move up and down relative to the stage.

The first member may include a first fixing portion that fixes the first end portion of the donor film and a first connection portion that moves the first fixing portion up and down relative to the stage. The second member may include a second fixing portion that fixes the second end portion of the donor film and a second connection portion that moves the second fixing portion up and down relative to the stage.

During a delamination process of the donor film and the acceptor substrate, the first member may be configured to lift the first end portion of the donor film to separate the first end portion from the acceptor substrate while the second member is stationary.

The supporting portion may be configured to separate the donor film from the acceptor substrate before lamination. The discharging outlet may be configured to discharges gas existing in a space between the acceptor substrate and the donor film to the outside.

The supporting portion may be configured to hold the donor film taut while discharging the gas to the outside. The supporting portion may be configured to pull the first and second end portions of the donor film in opposite directions.

The LITI apparatus may include a pressurizing member configured to contact the donor film and apply pressure to the donor film toward the acceptor substrate. The pressurizing member may include a roller.

During lamination, the pressurizing member adheres the donor film to the acceptor substrate by applying pressure to the donor film toward the acceptor substrate. During delamination, the supporting portion may be configured to lift the first end portion of the donor film. As the supporting portion lifts the first end portion of the donor film, the pressurizing member may be configured to apply pressure to the donor film while moving along from the first end portion of the donor film to the second end portion.

At least one of the above and other features and advantages may be realized by providing a method of manufacturing an organic light emitting display device using a laser induced thermal imaging (LITI) method, the method including disposing an acceptor substrate on a stage, disposing a donor film spaced from the acceptor substrate, the donor film including a film to be disposed on the acceptor substrate, removing gas between the acceptor substrate and the donor film, laminating the donor film on the acceptor substrate, transferring the film of the donor film onto the acceptor substrate, and delaminating the donor film from the acceptor substrate.

The method may include maintaining a uniform distance between the acceptor substrate and the donor film while removing the gas. Maintaining the uniform distance may include holding the donor film taut. Holding the donor film taut may include pulling a first end portion of the donor film and a second end portion, opposite the first end portion, in opposite directions.

Laminating may include applying pressure to the donor film toward the acceptor substrate. Laminating may include adhering a first end portion of the donor film to the acceptor substrate and then adhering a second end portion, opposite the first end portion, to the acceptor substrate.

Transferring may include irradiating the donor film.

Delaminating may include lifting a first end portion of the donor film and applying pressure along the donor film from the first end portion to a second end portion, opposite to the first end portion.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
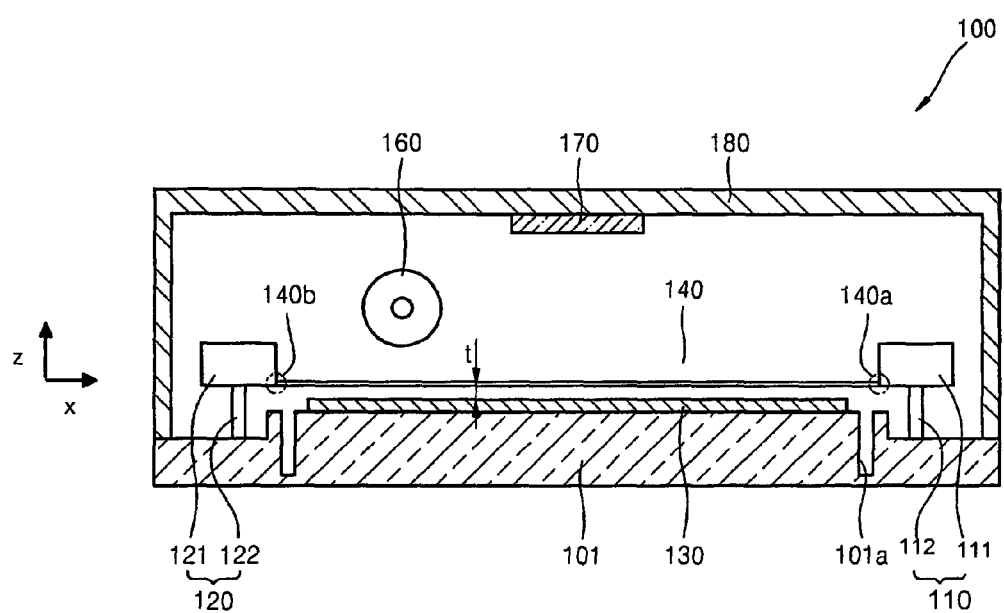
FIG. 1 illustrates a cross-sectional view of a laser induced thermal imaging (LITI) apparatus according to an embodiment.

Korean Patent Application No. 10-2010-0007445, filed on Jan. 27, 2010, in the Korean Intellectual Property Office, and entitled: "Organic Laser Induced Thermal Imaging Apparatus and Method of Manufacturing Organic Light Emitting Display Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawings, like reference numerals in the drawings denote like elements, and repeated descriptions thereof will be omitted. Further, details regarding related well-known functions or constructions will not be explained in detail for clarity of explanation of the example embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the present description, terms such as "first", "second", etc. are used to describe various elements. However, it is obvious that the elements should not be defined by these terms. The terms are used only for distinguishing one element from another element.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises", "includes", and/or "has," when used in this specification, specify the presence of stated features, integers, steps, operations, elements, and/or components, but do not preclude the presence or addition of one or more other features, integers, steps, operations, elements, components, and/or groups thereof.

FIG. 1 illustrates a cross-sectional view of a laser induced thermal imaging (LITI) apparatus 100 according to an embodiment. Referring to FIG. 1, the LITI apparatus 100 may include a stage 101, supporting portions 110 and 120, a pressurizing member 160, a laser irradiation apparatus 170, and a chamber 180.

The stage 101 is disposed in the chamber 180 and an acceptor substrate 130 may be disposed on the stage 101. The stage 101 may further include a discharging outlet 101a. The discharging outlet 101a refers to a path that connects inner and outer portions of the chamber 180. Gas existing in a space between the acceptor substrate 130 disposed on the stage 101 and a donor film 140 disposed over the acceptor substrate 130 may be discharged out of the chamber 180 through the discharging outlet 101a. This discharging through the discharging outlet 101a will be described later in more detail. The stage 101 may further include a driving unit (not shown) that moves the stage 101. For example, if light output from the laser irradiation apparatus 170 is vertically incident, i.e., along the z-direction, on the stage 101, a driving unit that moves the stage 101 horizontally, i.e., along the x-direction, may be further included.

The supporting portions 110 and 120 may support the donor film 140 such that the donor film 140 is disposed over the acceptor film 130. The supporting portions 110 and 120 may respectively hold two end portions, i.e., first and second end portions 140a and 140b of the donor film 140 opposite each other, and may move the donor film 140 up and down, i.e., along the z-direction, with respect to the stage 101. The supporting portions 110 and 120 may be referred to as a first member and a second member, respectively.

The first member 110 may include a first fixing portion 111 that fixes the first end portion 140a of the donor film 140 and a first connection portion 112 that moves the first fixing portion 111 up and down relative to the stage 101. The second member 120 may include a second fixing portion 121 that fixes the second end portion 140b of the donor film 140 and a second connection portion 122 that moves the second fixing portion 121 up and down relative to the stage 101.

The supporting portions 110 and 120 may move independently of each other. In detail, the supporting portions 110 and 120 may rise or descend at different speeds or at the same speed along the z-direction. For example, the first connection portion 112 may rise while the first end portion 140a of the donor film 140 is fixed to the first fixing portion 111, while the second connection portion 122 may not rise or may rise later than the first connection portion 112, and vice versa. Also, the first member 110 and the second member 110 and 120 may rise or descend at the same speed along the z-direction at the same time.

As the first and second members 110 and 120 may move independently of each other, a distance "t" between the donor film 140 and the acceptor substrate 130 may be adjusted, and adhesion characteristics between the donor film 140 and the acceptor substrate 130 may be increased during a lamination process. In a delamination process, a thin film transferred onto the acceptor substrate 130 may be prevented from being lifted off. This will be described in more detail later.

The pressurizing member 160 may apply pressure to the donor film 140 toward the acceptor substrate 130 during a lamination process of the donor film 140 and the acceptor substrate 130 to adhere the donor film 140 and the acceptor substrate 130. That is, during the lamination process, the first member 110 and the second member 120 descend such that the donor film 140 and the acceptor substrate 130 are in contact with and adhere to each other. Then the pressurizing member 160 applies pressure to the donor film 140 toward the acceptor substrate 130 so as to further increase the adhesion characteristics between the donor film 140 and the acceptor substrate 130. The pressurizing member 160 may include a roller, as illustrated in FIG. 1. In this case, the pressurizing member 160 may be rolled on the donor film 140 to increase the adhesion characteristics between the donor film 140 and the acceptor substrate 130.

Also, the pressurizing member 160 may prevent a thin film that has been transferred from the donor film 140 onto the acceptor substrate 130 from being lifted off during a delamination process of the donor film 140 and the acceptor substrate 130. In detail, during the delamination process, first, the first member 110 may lift up the first end portion 140a of the donor film 140. As the first member 110 lifts the first end portion 140a of the donor film 140, the pressurizing member 160 may move along from the first end portion 140a of the donor film 140 to the second end portion 140b to apply pressure to the donor film 140, thereby preventing a thin film transferred from the donor film 140 to the acceptor substrate 130 from being lifted off during the delamination process, i.e., removal of the donor film 140 from the acceptor substrate 130.

Figure 2:
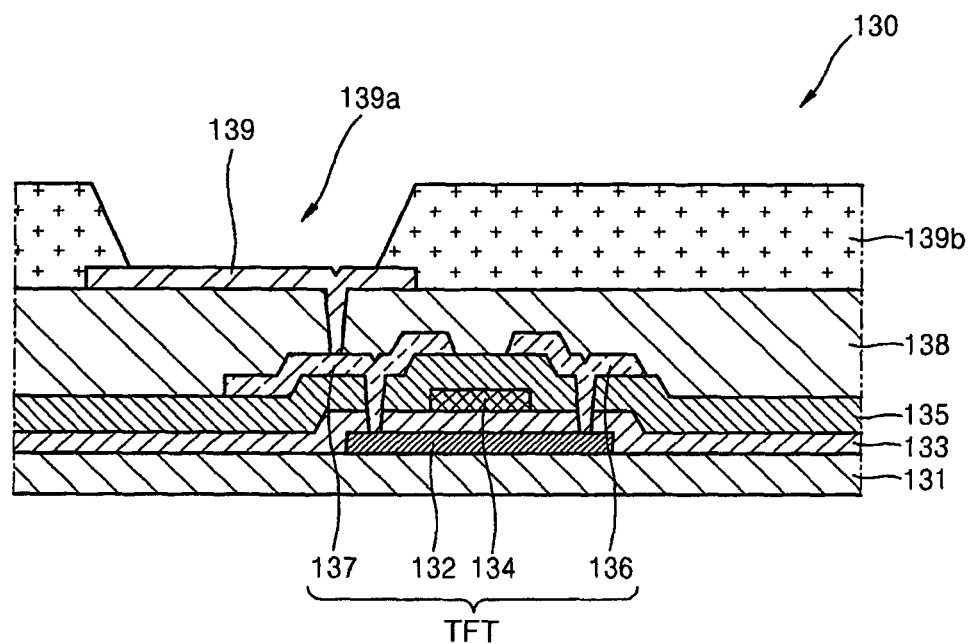
FIG. 2 illustrates a cross-sectional view of a structure of an organic light emitting display device.

FIG. 2 illustrates a cross-sectional view of a structure of an organic light emitting display device according to an embodiment. The organic light emitting display device may serve as the acceptor substrate 130. Referring to FIG. 2, the organic light emitting display device may include a substrate 131, thin film transistor (TFT), insulating layers 133, 135, 138, and a pixel electrode 139.

In detail, a semiconductor layer 132 may be formed on a predetermined portion of the substrate 131. The semiconductor layer 132 may be an amorphous silicon layer or a polycrystalline silicon layer that is formed by crystallizing an amorphous silicon layer. A gate insulating layer 133, which is a first insulating layer, may be disposed on the semiconductor layer 132. A gate electrode 134 that overlaps the semiconductor layer 132 may be disposed on the gate insulating layer 133. A second insulating layer 135 that covers the semiconductor layer 132 and the gate electrode 134 may be disposed on the gate electrode 134. A source electrode 136 and a drain electrode 137, passing through the second insulating layer 135 and the first insulating layer 132 and contacting two end portions of the semiconductor layer 132, may be disposed on the second insulating layer 135. The semiconductor layer 132, the gate electrode 134, and the source/drain electrodes 136 and 137 form the TFT. A third insulating layer 138 covering the source/drain electrodes 136 and 137 may be disposed on the source/drain electrodes 136 and 137. The third insulating layer 138 may be a passivation layer that protects the TFT and/or a planarizing layer that reduces surface unevenness due to the TFT.

The pixel electrode 139 may pass through the third insulating layer 138 to contact the drain electrode 137 and may be disposed on the third insulating layer 138. The pixel electrode 139 may be, for example, an indium tin oxide (ITO) layer or an indium zinc oxide (IZO) layer. A pixel defining layer 139b having an open portion 139a that exposes a portion of the pixel electrode 139 may be disposed on the pixel electrode 139.

Figure 3:
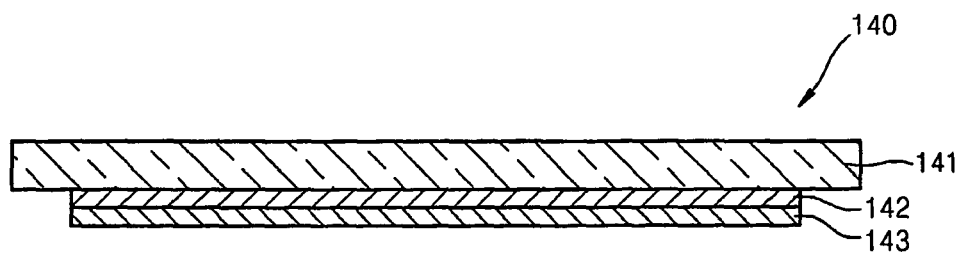
FIG. 3 illustrates a cross-sectional view of a structure of a donor film.

FIG. 3 illustrates a cross-sectional view of a structure of the donor film 140. Referring to FIG. 3, the donor film 140 may include a base film 141, and a photothermal conversion layer 142 and a transfer layer 143 that are sequentially stacked on a surface of the base film 141 and have a predetermined elasticity.

The base film 141 may be formed of a transparent polymer organic material such as polyethylene terephthalate (PET), polyethylenenaphthalate (PEN), polyethylene (PE), or polycarbonate (PC). The photothermal conversion layer 142 converts incident light into heat, and may include a light-absorbing material such as an aluminum oxide, an aluminum sulfide, carbon black, graphite or infrared ray pigments. When the acceptor substrate 130 is an organic light emitting device substrate, the transfer layer 143 may be an organic transfer layer. The organic transfer layer 143 may be one of a hole injecting layer (HIL), a hole transporting layer (HTL), an electroluminescent layer (ELL), a hole blocking layer (HBL), an electron transporting layer (ETL), and an electron injecting layer (EIL).

Figure 4:
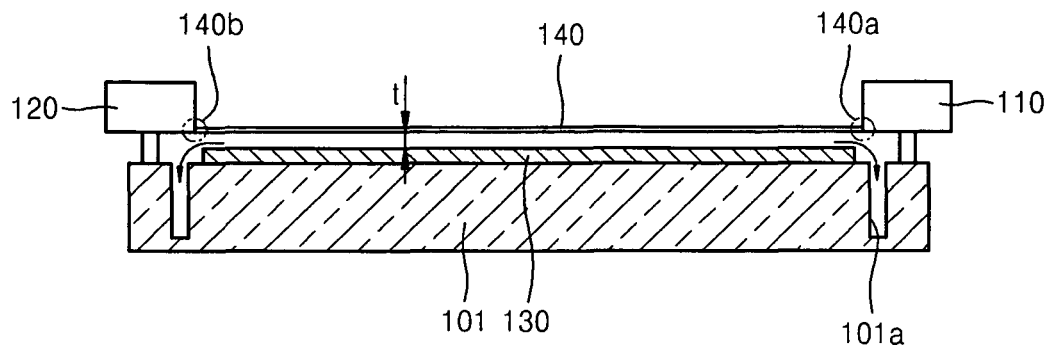
FIGS. 4 through 6 illustrate cross-sectional views of stages in a lamination method performed using the LITI apparatus of FIG. 1.
Figure 5:
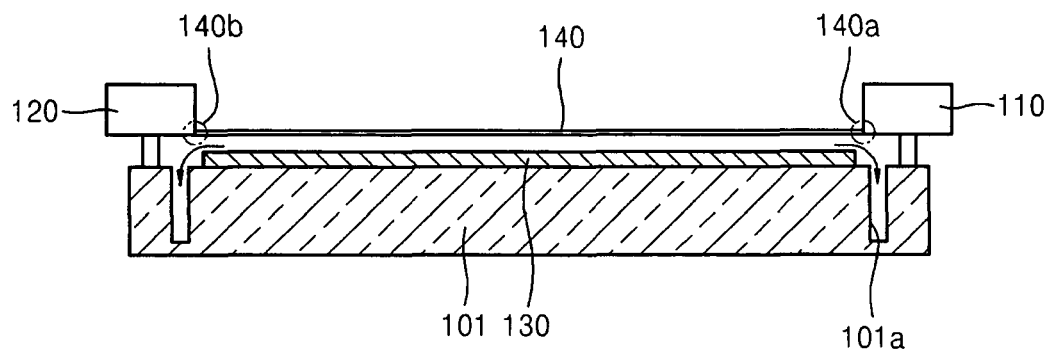
Figure 6:
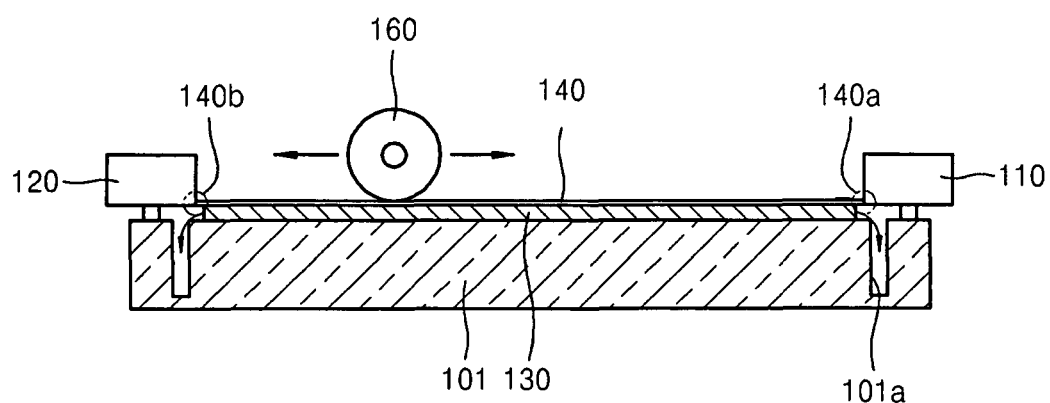

FIGS. 4 through 6 illustrate cross-sectional views of stages in a lamination method performed using the LITI apparatus of FIG. 1.

Referring to FIG. 4, the first member 110 and the second member 120, which are the supporting portions, respectively hold the first end portion 140a and the second end portion 140b of the donor film 140. Since the first and second members 110 and 120 can move up and down, a distance t between the donor film 140 and the acceptor substrate 130 may be maintained or the donor film 140 may descend towards the acceptor substrate 130. To prevent the donor film 140 from drooping toward the acceptor film 130 before lamination is to be performed, the first and second members 110 and 120 may hold the donor film 140 taut by pulling the first end portion 140a and the second end portion 140b in opposite directions.

Next, referring to FIG. 5, while the donor film 140 and the acceptor substrate 130 are maintained at a predetermined distance t from each other, gas existing between the donor film 140 and the acceptor substrate 130 is removed. The gas may be discharged through the discharging outlet 101a formed in the stage 101. By discharging the gas through the discharging outlet 101a, a vacuum may be formed between the donor film 140 and the acceptor substrate 130. Consequently, the adhesion characteristics between the donor film 140 and the acceptor substrate 130 may be improved during lamination.

Next, referring to FIG. 6, the first and second members 110 and 120 cause the donor film 140 to descend toward the acceptor substrate 130, thereby laminating the donor film 140 and the acceptor substrate 130. Also, the adhesion characteristics between the donor film 140 and the acceptor substrate 130 may be increased by using the pressurizing member 160. That is, as illustrated in FIG. 6, the pressurizing member 160, e.g., a roller, may apply pressure to the donor film 140 toward the acceptor substrate 130, thereby increasing the adhesion characteristics between the donor film 140 and the acceptor substrate 130.

Figure 7:
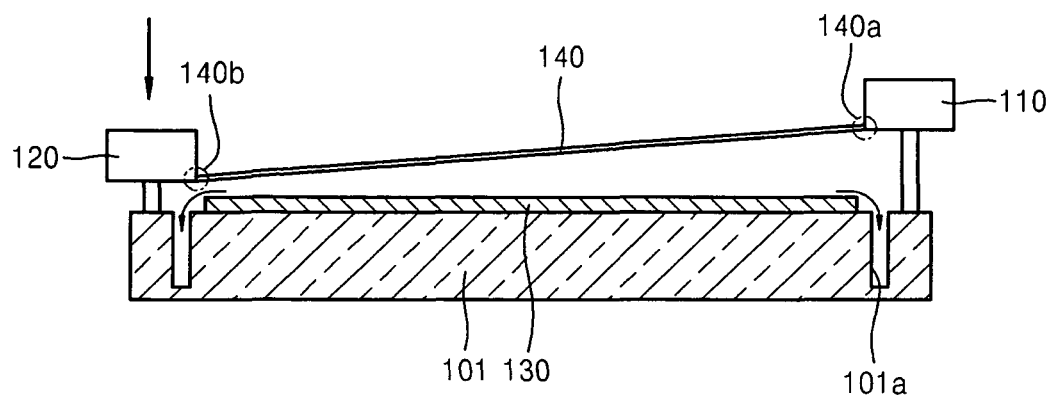
FIG. 7 illustrates a schematic view of a lamination process according to another embodiment.

FIG. 7 illustrates a schematic view of a stage in a lamination process according to another embodiment. As illustrated therein, when bringing the donor film 140 into contact with the acceptor substrate 130 by causing the first and second members 110 and 120 to descend, the first and second members 110 and 120 do not have to move in the same manner, but may move at different speeds. Thus, a portion of the donor film 140 is first adhered to the acceptor substrate 130 and then another portion of the donor film 140 is adhered to the acceptor substrate 130.

In detail, the second member 120 may descend before the first member 110 as illustrated in FIG. 7. In this case, the second end portion 140b held by the second member 120 contacts and adheres to the acceptor substrate 130 prior to the first end portion 140a. Then, the first member 110 may descend such that a center portion of the donor film 140 contacts and adheres to the acceptor substrate 130. Finally the first end portion 140a contacts and adheres to the acceptor substrate 130. As described above, a portion of the donor film 140 may be first adhered to the acceptor substrate 130 and then another portion of the donor film 140 may be adhered to the acceptor substrate 130 to increase the adhesion characteristics between the donor film 140 and the acceptor substrate 130.

Figure 8:
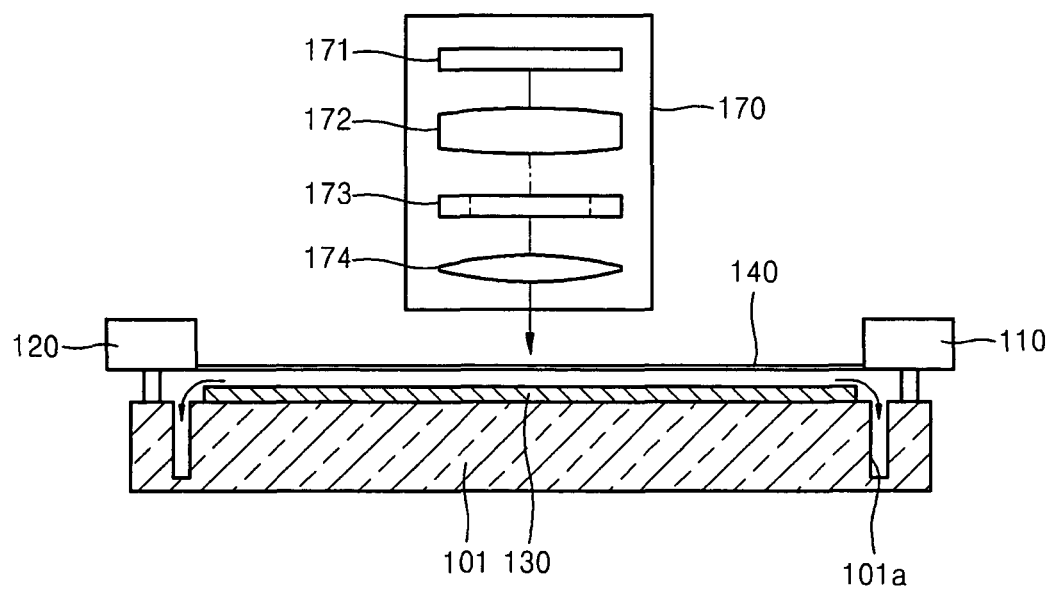
FIG. 8 illustrates a cross-sectional view of a laser irradiation process according to an embodiment.

FIG. 8 illustrates a cross-sectional view of a laser irradiation process according to an embodiment of the present invention. Referring to FIG. 8, the laser irradiation apparatus 170 may include a laser source 171, a beam shaping element 172, a mask 173, and a projection lens 174.

A beam generated from the laser source 171 passes through the beam shaping element 172 to be formed into a beam having, e.g., a normalized flat-top profile. The normalized beam may pass through the mask 173. The mask 173 may include at least one light-transmissive pattern or at least one light-reflecting pattern. The beam that has passed through the mask 173 may pass through the projection lens 174 to be irradiated onto the acceptor substrate 130.

Figure 9:
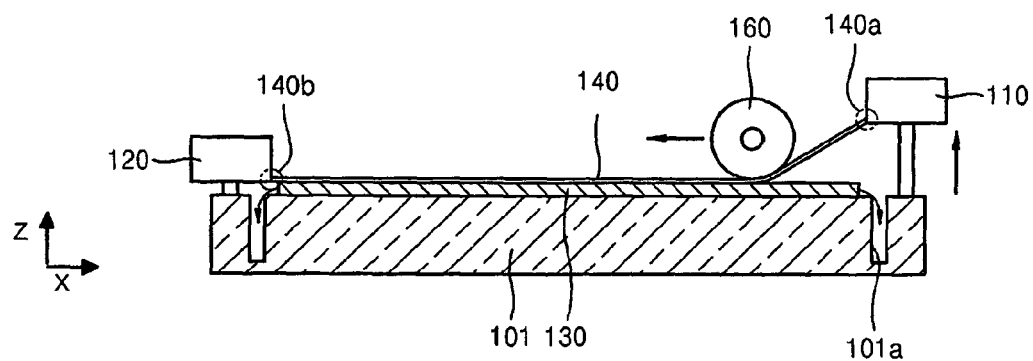
FIG. 9 illustrates a cross-sectional view of a delamination process performed using a LITI apparatus, according to an embodiment.

FIG. 9 illustrates a cross-sectional view of a delamination process performed using a LITI apparatus, according to an embodiment of the present invention. After the lamination process of the donor film 140 and the acceptor substrate 130, the organic transfer layer 143 of the donor film 140 has been transferred onto the acceptor substrate 130 due to laser induced thermal imaging, a delamination process, i.e., removing the donor film 140 from the acceptor substrate 130, is performed. To perform the delamination process, the LITI apparatus according to the current embodiment of the present invention may use the pressurizing member 160 as illustrated in FIG. 9.

In detail, during the delamination process, the first member 110 may be lifted first along the z-axis, such that the first end portion 140a of the donor film 140 is detached from the acceptor substrate 130. Here, the pressurizing member 160 may apply pressure to the donor film 140 toward the acceptor substrate 130 in a portion where the donor film 140 and the acceptor substrate 130 are being separated, thereby preventing the organic transfer layer 143 transferred onto the acceptor substrate 130 from being lifted off with the donor film 140. As the first member 110 lifts the first end portion 140a of the donor film 140, the pressurizing member 160 may move from the first end portion 140a to the second end portion 140b of the donor film 140 in the x-direction.

Figure 10:
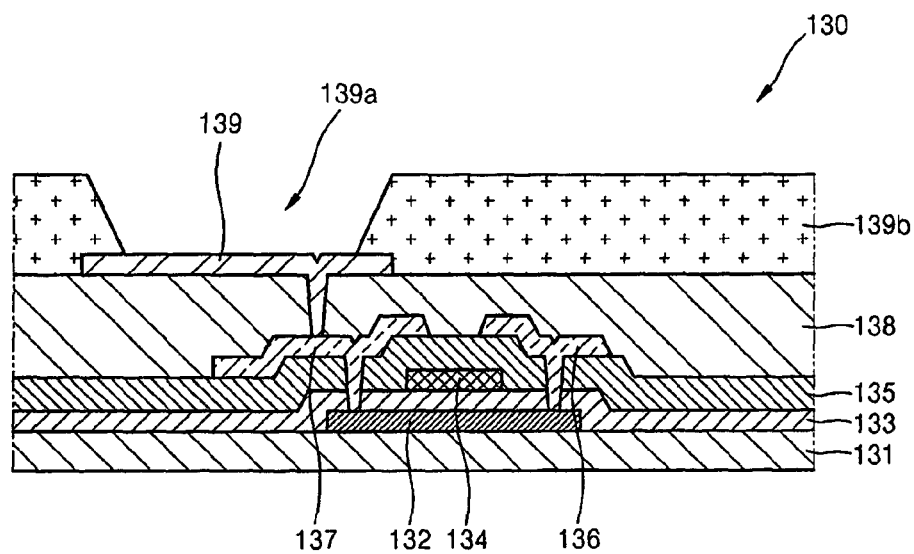
FIGS. 10 through 14 illustrate cross-sectional views of stages in a method of manufacturing an organic light emitting display device, according to an embodiment.

FIGS. 10 through 14 illustrate cross-sectional views of stages in a method of manufacturing an organic light emitting display device, according to an embodiment. FIG. 10 is the same as FIG. 2, and a detailed description thereof will not be repeated.

Referring to FIG. 10, when forming a light emitting layer using a LITI method, according to an embodiment, the acceptor substrate 130 is first formed. As described above, the acceptor substrate 130 may include the substrate 131 and the TFT including the semiconductor layer 132, the gate insulating layer (first insulating layer) 133, the gate electrode 134, the second insulating layer 135, and source/drain electrodes 136 and 137 on the substrate 131. Also, the pixel electrode 139 and the pixel defining layer 139b that includes the open portion 139a, through which a portion of the pixel electrode 139 is exposed, are formed on the TFT.

Figure 11:
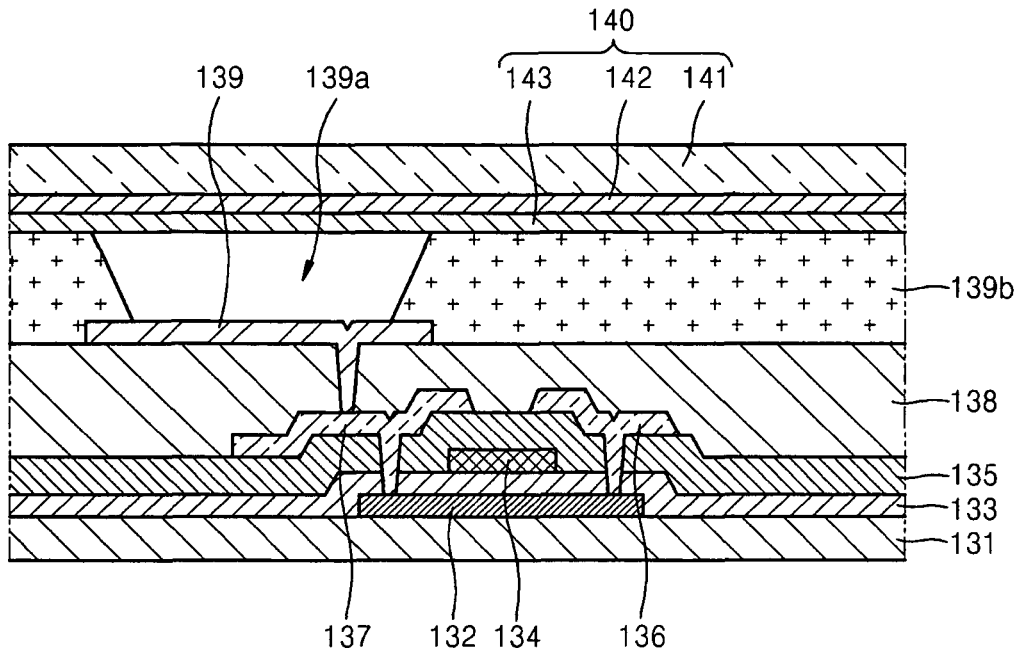

Then, referring to FIG. 11, the donor film 140 is laminated on the acceptor substrate 130. The transfer efficiency during a transfer process increases as the adhesion characteristics between the donor film 140 and the acceptor substrate 130 increases. To improve the adhesion characteristics, pressure may be applied to the donor film 140 by using the pressurizing member 160. The donor film 140 is the same as that illustrated in FIG. 3, and a detailed description thereof will not be repeated.

Figure 12:
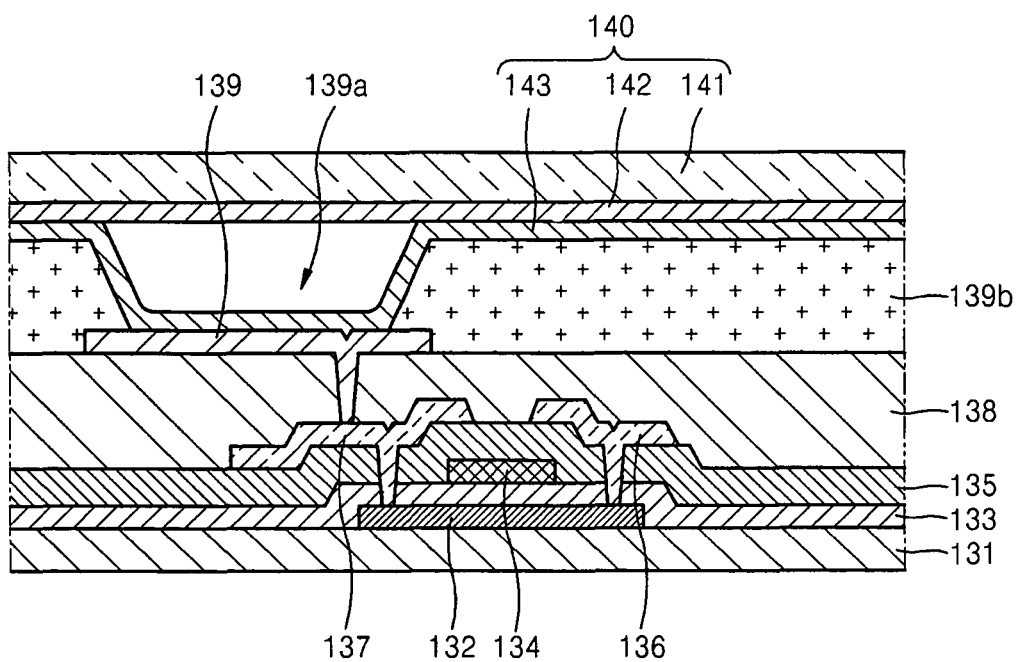

Then, referring to FIG. 12, while the acceptor substrate 130 and the donor film 140 are laminated, the laser is irradiated only to a portion to which the light emitting layer 143 is to be transferred. When laser is irradiated, the transfer layer 143 is also expanded as the photothermal conversion layer 142 is expanded toward the acceptor substrate 130. Thus, the transfer layer 143 in the portion where the laser is irradiated is separated from the donor film 140 and is transferred onto the acceptor substrate 130.

Figure 13:
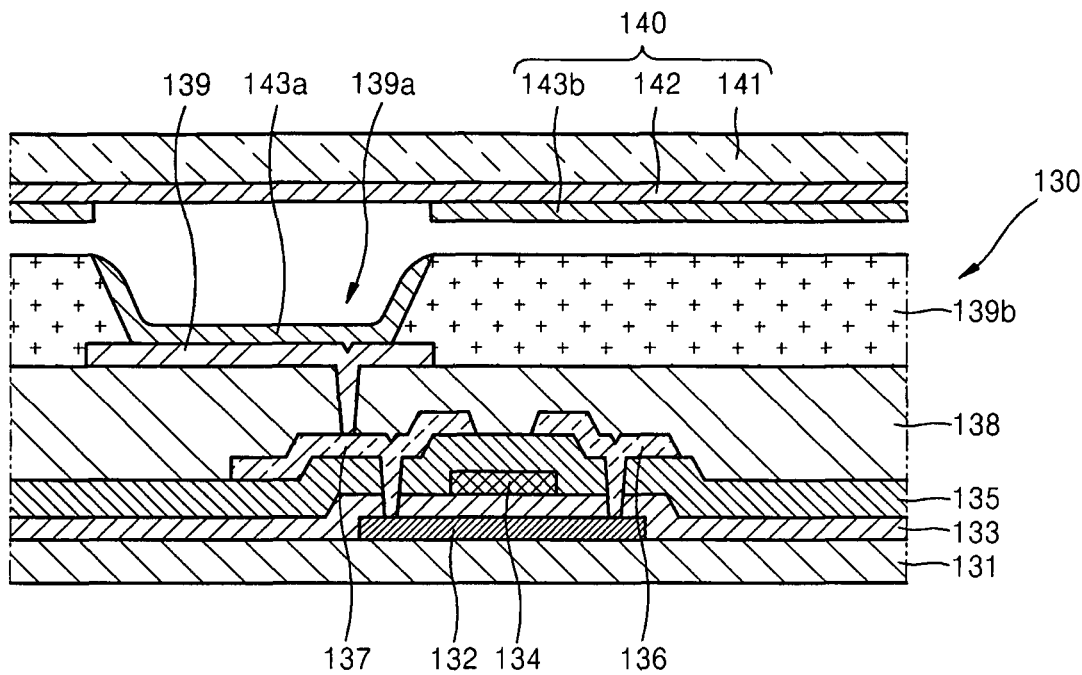

Referring to FIG. 13, when a portion 143a of the transfer layer 143 is transferred on the acceptor substrate 130, the donor film 140 and the acceptor substrate 130 are separated. The portion 143a of the transfer layer 143 is formed on at least a portion of the pixel defining layer 139 and an open portion 139a on the acceptor substrate 130. Only the portion 143a of the transfer layer 143 where laser is irradiated is transferred onto the acceptor substrate 130. A remaining portion 143b remains on the donor film 140.

Then, the donor film 140 including the remaining portion 143b is removed during delamination. As noted above with respect to FIG. 9, this delamination may include using the pressurizing member 160 to minimize lift-off of the portion 143a.

Figure 14:
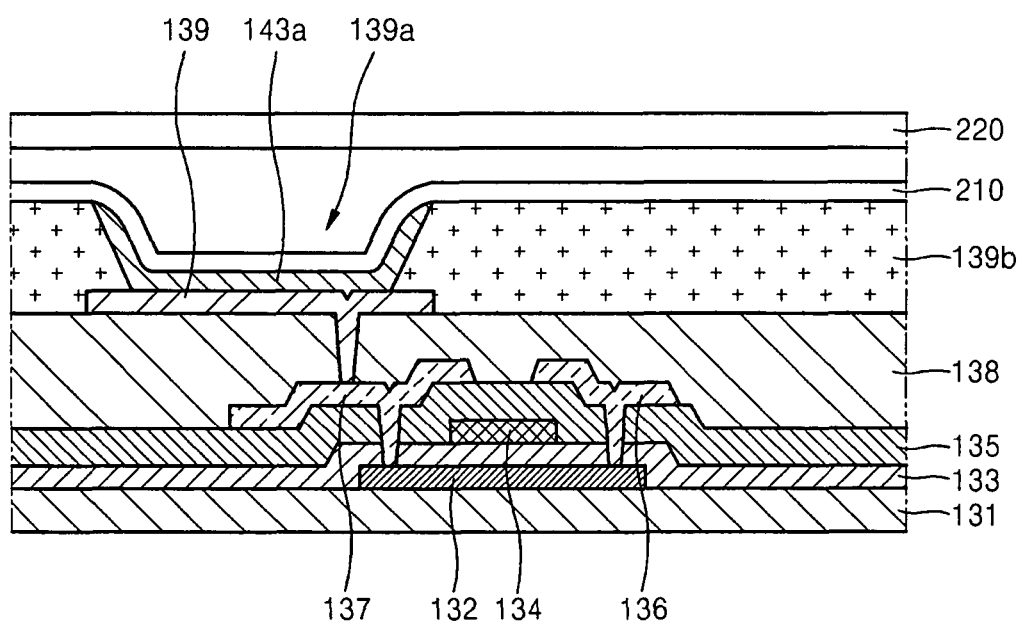

Finally, referring to FIG. 14, after the portion 143a of the transfer layer 143 has been transferred onto the acceptor substrate 130 and the donor film 140 has been removed, a second electrode layer 210 may be formed on the portion 143a of the transfer layer 143 and an encapsulation layer 220 may be formed on the second electrode layer 210 to protect the organic light emitting device.

According to embodiments, the adhesion characteristics between a substrate and a donor film during a lamination process may be increased, and the likelihood that an organic layer transferred to the substrate is lifted off may be minimized.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A laser induced thermal imaging (LITI) apparatus, comprising:
a stage configured to support an acceptor substrate; and
a supporting portion configured to support a donor film and to move the donor film up and down relative to the stage so as to adjust a distance between the acceptor substrate and the donor film, the donor film including a thin film to be disposed on the acceptor substrate, wherein the stage includes a discharging outlet through which gas between the acceptor substrate and the donor film is discharged to the outside, and wherein the supporting portion includes:
- a first member supporting a first end portion of the donor film; and
- a second member supporting a second end portion of the donor film, opposite the first end portion of the donor film, the first member and the second member being individually moveable up and down relative to the stage.

2. The LITI apparatus as claimed in claim 1, wherein the first member comprises a first fixing portion that fixes the first end portion of the donor film and a first connection portion that moves the first fixing portion up and down relative to the stage.

3. The LITI apparatus as claimed in claim 1, wherein the second member comprises a second fixing portion that fixes the second end portion of the donor film and a second connection portion that moves the second fixing portion up and down relative to the stage.

4. The LITI apparatus as claimed in claim 1, wherein, during a delamination process of the donor film and the acceptor substrate, the first member is configured to lift the first end portion of the donor film to separate the first end portion from the acceptor substrate while the second member is stationary.

5. The LITI apparatus as claimed in claim 1, wherein the supporting portion is configured to separate the donor film from the acceptor substrate before a lamination process, and the discharging outlet is configured to discharges gas existing in a space between the acceptor substrate and the donor film to the outside.

6. The LITI apparatus as claimed in claim 1, wherein the supporting portion is configured to hold the donor film taut while discharging the gas to the outside.

7. The LITI apparatus as claimed in claim 6, wherein the supporting portion is configured to pull the first and second end portions of the donor film in opposite directions.

8. The LITI apparatus as claimed in claim 1, further comprising a pressurizing member configured to contact the donor film and apply pressure to the donor film toward the acceptor substrate.

9. The LITI apparatus as claimed in claim 8, wherein, during lamination, the pressurizing member adheres the donor film to the acceptor substrate by applying pressure to the donor film toward the acceptor substrate.

10. The LITI apparatus as claimed in claim 8, wherein, during delamination, the supporting portion is configured to lift the first end portion of the donor film and, as the supporting portion lifts the first end portion of the donor film, the pressurizing member is configured to apply pressure to the donor film while moving along from the first end portion of the donor film to the second end portion.

11. The LITI apparatus as claimed in claim 8, wherein the pressurizing member includes a roller.

12. A method of manufacturing an organic light emitting display device using a laser induced thermal imaging (LITI) method, the method comprising:
- disposing an acceptor substrate on a stage;
- disposing a donor film separate from the acceptor substrate on first and second members of a supporting portion, the first and second members being individually moveable up and down relative to the stage and configured to support first and second end portions of the donor film, and the donor film including a film to be disposed on the acceptor substrate;
- removing gas between the acceptor substrate and the donor film;
- laminating the donor film on the acceptor substrate;
- transferring the film of the donor film onto the acceptor substrate; and
- delaminating the donor film from the acceptor substrate.

13. The method as claimed in claim 1, further comprising maintaining a uniform distance between the acceptor substrate and the donor film while removing the gas.

14. The method as claimed in claim 13, wherein maintaining the uniform distance includes holding the donor film taut.

15. The method as claimed in claim 12, wherein laminating further comprises applying pressure to the donor film toward the acceptor substrate.

16. The method as claimed in claim 12, wherein laminating includes:
- adhering the first end portion of the donor film to the acceptor substrate; and
- then adhering the second end portion of the donor film to the acceptor substrate.

17. The method as claimed in claim 12, wherein transferring includes irradiating the donor film.

18. The method as claimed in claim 12, wherein delaminating includes lifting the first end portion of the donor film and applying pressure along the donor film from the first end portion to the second end portion of the donor film.

19. A method of manufacturing an organic light emitting display device using a laser induced thermal imaging (LITI) method, the method comprising:
- disposing an acceptor substrate on a stage;
- disposing a donor film separate from the acceptor substrate, the donor film including a film to be disposed on the acceptor substrate;
- maintaining a uniform distance between the acceptor substrate and the donor film while removing gas between the acceptor substrate and the donor film, wherein maintaining the uniform distance includes holding the donor film taut, by pulling a first end portion of the donor film and a second end portion, opposite the first end portion, in opposite directions;
- laminating the donor film on the acceptor substrate;
- transferring the film of the donor film onto the acceptor substrate; and
- delaminating the donor film from the acceptor substrate.

* * * * *